United States Patent
Chou et al.

(10) Patent No.: US 11,552,188 B2
(45) Date of Patent: Jan. 10, 2023

(54) HIGH-VOLTAGE SEMICONDUCTOR STRUCTURE

(71) Applicant: Vanguard International Semiconductor Corporation, Hsinchu (TW)

(72) Inventors: Yu-Chieh Chou, New Taipei (TW); Tsung-Hsiang Lin, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 156 days.

(21) Appl. No.: 17/102,441

(22) Filed: Nov. 24, 2020

(65) Prior Publication Data
US 2022/0165872 A1 May 26, 2022

(51) Int. Cl.
*H01L 29/06* (2006.01)
*H01L 29/778* (2006.01)
(Continued)

(52) U.S. Cl.
CPC ...... *H01L 29/7786* (2013.01); *H01L 27/0605* (2013.01); *H01L 29/0653* (2013.01); *H01L 29/2003* (2013.01); *H01L 29/205* (2013.01)

(58) Field of Classification Search
CPC ............. H01L 29/0653; H01L 29/2003; H01L 29/205; H01L 29/1066; H01L 29/7786; H01L 21/76224–76237; H01L 21/76283; H01L 21/76286; H01L 27/0605; H01L 27/0629; H01L 27/0635; H01L 27/0647–067; H01L 27/0711–0722; H01L 27/0705–0738; H01L 27/075–0783; H01L 27/0802; H01L 27/101; H01L 27/1112; H01L 29/402; H01L 29/41725–41791; H01L 29/41775; H01L 29/66462; H01L 29/66431;
(Continued)

(56) References Cited

U.S. PATENT DOCUMENTS

| 6,153,488 A | 11/2000 | Yoshino |
| 2007/0228416 A1 | 10/2007 | Chen |

(Continued)

FOREIGN PATENT DOCUMENTS

TW 201515223 A 4/2015

*Primary Examiner* — Natalia A Gondarenko
(74) *Attorney, Agent, or Firm* — Winston Hsu (57) ABSTRACT

A semiconductor structure includes a substrate, a semiconductor epitaxial layer, a semiconductor barrier layer, a first semiconductor device, a doped isolation region, and at least one isolation pillar. The substrate includes a core layer and a composite material layer, the semiconductor epitaxial layer is disposed on the substrate, and the semiconductor barrier layer is disposed on the semiconductor epitaxial layer. The first semiconductor device is disposed on the substrate, where the first semiconductor device includes a first semiconductor cap layer disposed on the semiconductor barrier layer. The doped isolation region is disposed at one side of the first semiconductor device. At least a portion of the isolation pillar is disposed in the doped isolation region, and the isolation pillar surrounds at least a portion of the first semiconductor device and penetrates the composite material layer.

20 Claims, 11 Drawing Sheets

(51) Int. Cl.
*H01L 29/20* (2006.01)
*H01L 29/205* (2006.01)
*H01L 27/06* (2006.01)

(58) Field of Classification Search
CPC ... H01L 29/66166; H01L 29/778–7789; H01L 29/76877; H01L 29/76897; H01L 29/0657; H01L 29/0692; H01L 29/8605
USPC ..... 257/76, 190, 192, 194, 256, 284, 29.093
See application file for complete search history.

(56) References Cited

U.S. PATENT DOCUMENTS

| | | |
|---|---|---|
| 2014/0264379 A1 | 9/2014 | Kub |
| 2014/0264449 A1* | 9/2014 | Parsey, Jr. ........... H01L 29/0649 257/194 |
| 2015/0008442 A1 | 1/2015 | Zhou |
| 2017/0309676 A1* | 10/2017 | Odnoblyudov ..... H01L 27/1203 |
| 2018/0323187 A1* | 11/2018 | Moen .................. H01L 29/7375 |
| 2020/0168599 A1* | 5/2020 | Udrea .................. H03K 17/687 |

* cited by examiner

HIGH-VOLTAGE SEMICONDUCTOR STRUCTURE

BACKGROUND OF THE INVENTION

1. Field of the Invention

The present disclosure relates to a high-voltage semiconductor structure, in particular to a high-voltage semiconductor structure with an isolation structure and a method of fabricating the same.

2. Description of the Prior Art

With the development of the 5G communication and electric vehicle industries, the demand for high-frequency, high-power semiconductor devices is also growing. These high-frequency, high-power semiconductor devices include, for example, high-frequency transistors, high-power field-effect transistors, or high electron mobility transistors (HEMT). High-frequency, high-power semiconductor devices generally use compound semiconductors, such as gallium nitride (GaN), silicon carbide (SiC) or other III-V compound semiconductors, and the electrical properties of these semiconductor devices include high operating frequency, high breakdown voltage, and low on-resistance.

For these devices, high electron mobility transistors have advantages, such as high output power and high breakdown voltage, so they are widely used in high power applications. Although conventional semiconductor structures and their fabricating methods could fulfill their intended uses, there are still several problems needs to be overcome in various technical aspects regarding, for example, their structures and the environment in which they are used.

SUMMARY OF THE INVENTION

In view of this, the present disclosure provides a semiconductor structure and its fabrication method to solve the technical problems faced by prior art.

In accordance with one embodiment of the present disclosure, a high-voltage semiconductor structure is provided and includes a substrate, a semiconductor channel layer, a semiconductor barrier layer, a semiconductor cap layer, a doped isolation region, and at least one isolation pillar. The substrate includes a core layer and a composite material layer. The semiconductor channel layer is disposed on the substrate, the semiconductor barrier layer is disposed on the semiconductor channel layer, and the semiconductor cap layer is disposed on the semiconductor barrier layer. The doped isolation region is disposed in the semiconductor channel layer and the semiconductor barrier layer and at least one side of the semiconductor cover layer. The isolation pillar is indirect contact with the doped isolation region, and the isolation pillar penetrates the semiconductor barrier layer, the semiconductor channel layer, and the composite material layer.

In accordance with another embodiment of the present disclosure, a chip structure is provided and includes a substrate, a high-voltage semiconductor structure, a low-voltage semiconductor structure, and at least one isolation pillar. The substrate includes a core layer and a composite material layer. The high-voltage semiconductor structure is disposed on the substrate, and the low-voltage semiconductor structure is disposed on the substrate and separated from the high-voltage semiconductor structure. The isolation pillar completely surrounds the high-voltage semiconductor structure and penetrates the composite material layer.

In accordance with another embodiment of the present disclosure, a method of operating a high-voltage semiconductor structure is provided and includes the step of providing a high-voltage semiconductor structure and applying an electronic signal to the high-voltage semiconductor structure at an ambient temperature above 150° C. The high-voltage semiconductor structure includes a substrate, a semiconductor channel layer, a semiconductor barrier layer, a semiconductor cap layer, a doped isolation region, and at least two isolation pillars. The substrate comprises a core layer and a composite material layer. The semiconductor channel layer is disposed on the substrate, the semiconductor barrier layer is disposed on the semiconductor channel layer, and the semiconductor cap layer is disposed on the semiconductor barrier layer. The doped isolation region is disposed in the semiconductor channel layer and the semiconductor barrier layer and at least one side of the semiconductor cap layer. The isolation pillar is in direct contact with the doped isolation region, and the isolation pillar penetrates the semiconductor barrier layer, the semiconductor channel layer, and the composite material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

The terms, such as "coupled to" and "electrically coupled to", disclosed herein encompass all means of directly and indirectly electrical connection. For example, when an element or layer is referred to as being "coupled to" or "electrically coupled to" another element or layer, it may be directly coupled or electrically coupled to the other element or layer, or intervening elements or layers may be presented.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited thereto, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, GaInP, AlGaAs, InAlAs, InGaAs, or the like, or the combination thereof. Besides, based on different requirements, group III-V semiconductor may contain dopants to become semiconductor with specific conductivity type, such as N-type or p-type.

It is understood that the specific order or hierarchy of blocks in the following disclosed processes/flowcharts is an illustration of exemplary approaches. Based upon design preferences, it is understood that the specific order or hierarchy of blocks in the processes/flowcharts may be rearranged. Further, some blocks may be combined or omitted.

Although the disclosure is described with respect to specific embodiments, the principles of the invention, as defined by the claims appended herein, may obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

Figure 1:
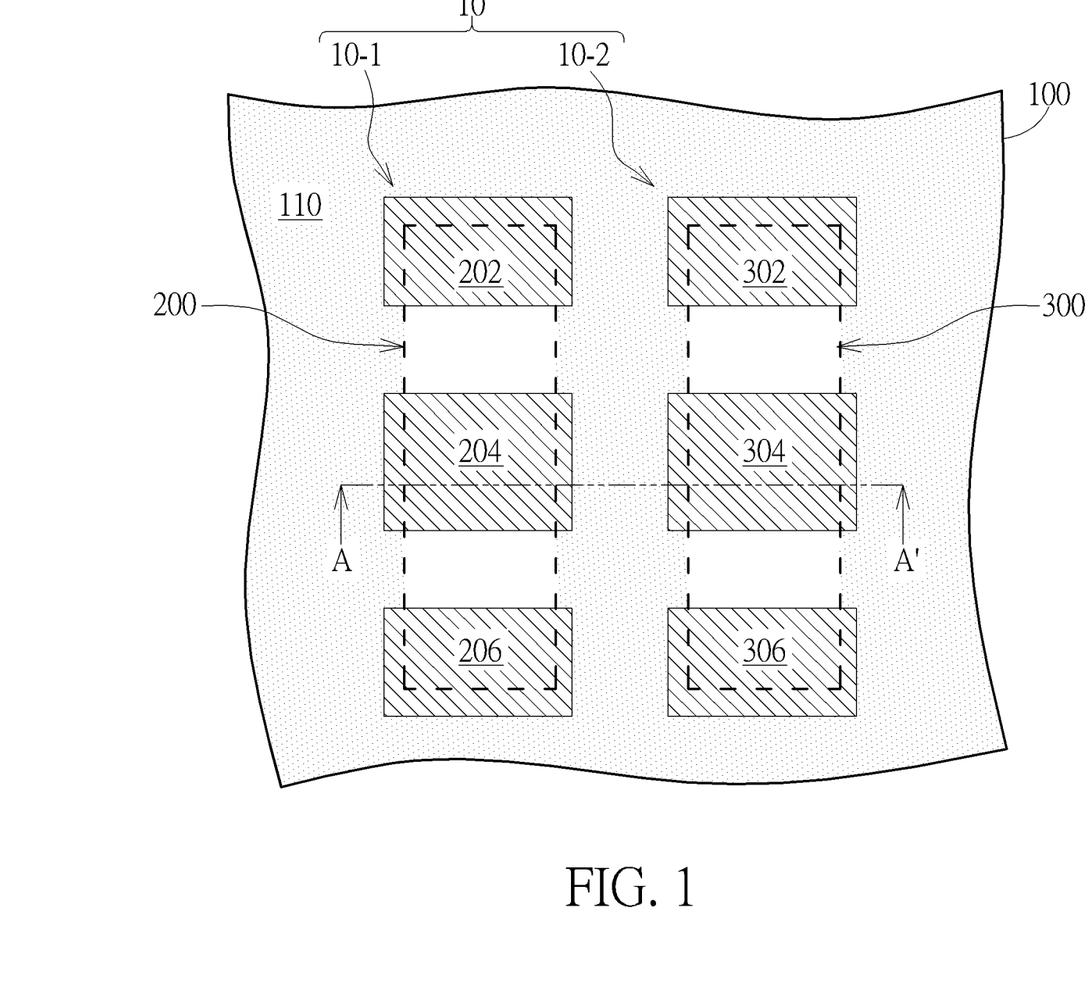
FIG. 1 is a schematic top view of a high-voltage semiconductor structure in accordance with one embodiment of the present disclosure.

FIG. 1 is a schematic top view of a high-voltage semiconductor structure in accordance with one embodiment of the present disclosure. Referring to FIG. 1, at least one high-voltage semiconductor structure may be disposed on a substrate 100, and the high-voltage semiconductor structure 10 may include at least one semiconductor device, such as a first high-voltage semiconductor device 10-1 and a second high-voltage semiconductor device 10-2. In accordance with one embodiment of the present disclosure, the first high-voltage semiconductor device 10-1 and the second high-voltage semiconductor device 10-2 may be semiconductor devices, such as high electron mobility transistors, operated at a source voltage or a drain voltage greater than 600V, but not limited thereto. In accordance with one embodiment of the present disclosure, the first high-voltage semiconductor device 10-1 may include an active region 200, a source electrode 202, a gate electrode 204, and a drain electrode 206. The source electrode 202, the gate electrode 204, and the drain electrode 206 may be electrically coupled to the corresponding regions of the active region 200, respectively. Electronic signals may be input to and output from the active region 200 through the source electrode 202 and the drain electrode 206, and the magnitude of current of the first high-voltage semiconductor device 10-1 may be controlled by applying an appropriate voltage to the gate electrode 204. Similarly, in accordance with one embodiment of the present disclosure, the second high-voltage semiconductor device 10-2 may include an active region 300, a source electrode 302, a gate electrode 304, and a drain electrode 306. The source electrode 302, the gate electrode 304, and the drain electrode 306 may be electrically coupled to the corresponding regions of the active region 300, respectively. Since the first high-voltage semiconductor device 10-1 and the second high-voltage semiconductor device 10-2 operate at a high voltage, the periphery of the first high-voltage semiconductor device 10-1 and the second high-voltage semiconductor device 10-2 may be provided with a doped isolation region 110 to achieve an electrical isolation between the first high-voltage semiconductor device 10-1 and the second high-voltage semiconductor device 10-2.

Figure 2:
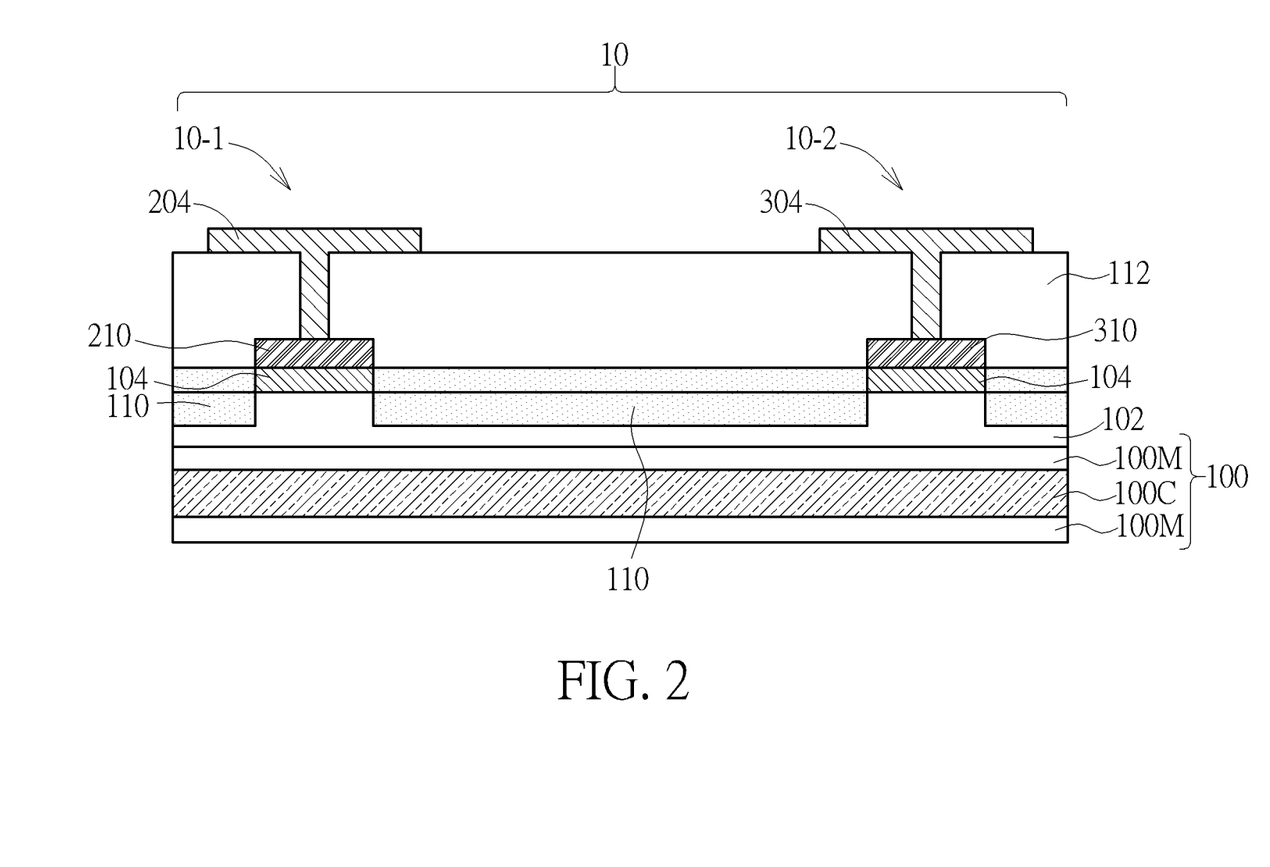
FIG. 2 is a schematic cross-sectional view of a high-voltage semiconductor structure taken along a line A-A' of FIG. 1 in accordance with one embodiment of the present disclosure.

FIG. 2 is a schematic cross-sectional view of the high-voltage semiconductor structure taken along a line A-A' of FIG. 1 in accordance with one embodiment of the present disclosure. Referring to FIG. 2, in accordance with one embodiment of the present disclosure, the high-voltage semiconductor structure 10 may include a substrate 100, a semiconductor epitaxial layer 102, a semiconductor barrier layer 104, a doped isolation region 110, at least two semiconductor cap layers 210 and 310, an interlayer dielectric layer 112, and at least two gate electrodes 204 and 304.

In accordance with one embodiment of the present disclosure, the substrate 100 may include a core layer 100C and a composite material layer 100M covering the core layer 100C. The composition of the core layer 100C may be ceramic material, such as silicon carbide (SiC), aluminum oxide ($Al_2O_3$), sapphire, aluminum nitride or a combination thereof. The composite material layer 100M may be disposed along the surface of the core layer 100C, for example, it may be disposed on the top surface and the bottom surface of the core layer 100C, or even on the side surface of the core layer 100C, but not limited thereto. Each composite material layer 100M may include stacked insulating layers and seed layers. In accordance with one embodiment of the present disclosure, with respect to the composite material layers 100M disposed on the top and bottom surfaces of the core layer 100C, the composite material layers 100M may each include a first insulating layer, a seed layer, and a second insulating layer in sequence along the direction away from the core layer 100C. The first insulating layer and the second insulating layer may be single-layer or multi-layer insulating material layers, such as oxide, nitride, oxynitride, or other suitable insulating materials. The seed layer may be semiconductor material, such as silicon, but not limited thereto. In accordance with one embodiment of the present disclosure, each composite material layer 100M may include an oxide layer, a semiconductor layer, a nitride layer, and an oxide layer stacked in sequence in the direction away from the core layer 100C, but not limited thereto. When the core layer 100C is a ceramic substrate, the substrate 100 is less likely to crack or bend because its mechanical strength is higher than that of a single crystal silicon substrate. In addition, since the electrical insulation of the ceramic substrate is higher than that of the single crystal silicon substrate, the substrate 100 is able to withstand higher voltage.

In accordance with one embodiment of the present disclosure, when the first high-voltage semiconductor device 10-1 and the second high-voltage semiconductor device 10-2 are both high electron mobility transistors, there may be a nitride layer, a super lattice layer, and a high resistance layer optionally disposed between the semiconductor epitaxial layer 102 and the substrate 100, but not limited thereto. The nitride layer with fewer lattice defects may be disposed on the substrate 100 so the epitaxial quality of the semiconductor layers (e.g., the semiconductor epitaxial layer 102) disposed over the nitride layer may be improved. The superlattice layer may be used to reduce the degree of lattice mismatch between the substrate 100 and the semiconductor layers (e.g., the semiconductor epitaxial layer 102) disposed over the superlattice layer, and reduce the stress caused by the lattice mismatch. Compared with other semiconductor layers, the high resistance layer has higher resistivity, so leakage current between the semiconductor layers (e.g., semiconductor epitaxial layer 102) disposed over the high resistance layer and the substrate 100 may be avoided.

The semiconductor epitaxial layer 102 may include one or more III-V semiconductor layers, and the compositions of the III-V semiconductor layers may be GaN, AlGaN, InGaN or InAlGaN, but not limited thereto. In accordance with one embodiment of the present disclosure, the semiconductor epitaxial layer 102 may include a semiconductor buffer layer and a semiconductor channel layer from bottom to top. The semiconductor channel layer is an undoped III-V semiconductor, such as undoped GaN (u-GaN). In accordance with one embodiment of the present disclosure, the semiconductor channel layer may also be one or more doped III-V semiconductor layers, such as p-type III-V semiconductor layers. For the p-type III-V semiconductor layer, its dopants may be Cd, Fe, Mg or Zn, but not limited thereto.

The semiconductor barrier layer 104 may include one or more III-V semiconductor layers, and the composition of the semiconductor barrier layer 104 may be different from that of the III-V semiconductor of the semiconductor channel layer. For example, the semiconductor barrier layer 104 may include AlN, $Al_yGa_{(1-y)}N$ (0<y<1), or a combination thereof. In accordance with one embodiment, the semiconductor barrier layer 104 may be an n-type III-V semiconductor, such as an intrinsic n-type AlGaN layer, but not limited thereto.

In addition, in accordance with one embodiment of the present disclosure, the semiconductor channel layer in the upper portion of the semiconductor epitaxial layer 102 may in direct contact with the semiconductor barrier layer 104, so the region of the semiconductor epitaxial layer 102 abutting the semiconductor barrier layer 104 may form a carrier flow region, such as a two-dimensional electron gas (2DEG) region. The semiconductor cap layers 210, 310 may be separated from each other, and each may include one or more p-type III-V semiconductor layers, such as p-type GaN layer(s), and the dopants of the p-type III-V semiconductor layers may be selected from Mg, Cd, Zn, or other metal dopants.

The doped isolation region 110 may be located in the semiconductor epitaxial layer 102 and the semiconductor barrier layer 104 at both sides of the semiconductor cap layers 210, 310, and the doped isolation region 110 is preferably disposed between the two separated semiconductor cap layers 210, 310 without overlapping the semiconductor cap layers 210, 310. In accordance with one embodiment of the present disclosure, the doped isolation region 110 may be formed by applying external energy to damage the crystal structures of the semiconductor epitaxial layer 102 and the semiconductor barrier layer 104, or by performing an ion implantation process to implant specific non-conductive dopants into the semiconductor epitaxial layer 102 and the semiconductor barrier layer 104. The dopants used to form the doped isolation region 110 may include helium, argon, nitrogen, phosphorus, arsenic, oxygen, or a combination thereof, but not limited thereto.

The interlayer dielectric layer 112 may be disposed on the doped isolation region 110 and cover the semiconductor cap layers 210, 310. An optional interconnection structure may be provided in the interlayer dielectric layer 112 to be electrically coupled to the semiconductor cap layers 210, 310 or the semiconductor barrier layer 104, but not limited thereto.

The gate electrodes 204, 304 may be disposed on the top surface of the interlayer dielectric layer 112 and electrically coupled to the corresponding semiconductor cap layers 210, 310. In accordance with one embodiment of the present disclosure, the gate electrodes 204, 304 and other electrodes, such as the source electrodes and the drain electrodes, disposed in the first high-voltage semiconductor device 10-1 and the first high-voltage semiconductor structure 10-2 may be made of conductive materials, such as Au, Ni, Pt, Pd, Ir, Ti, Cr, W, Al, Cu, TaN, TiN, similar materials thereof, or a combination thereof.

Figure 3:
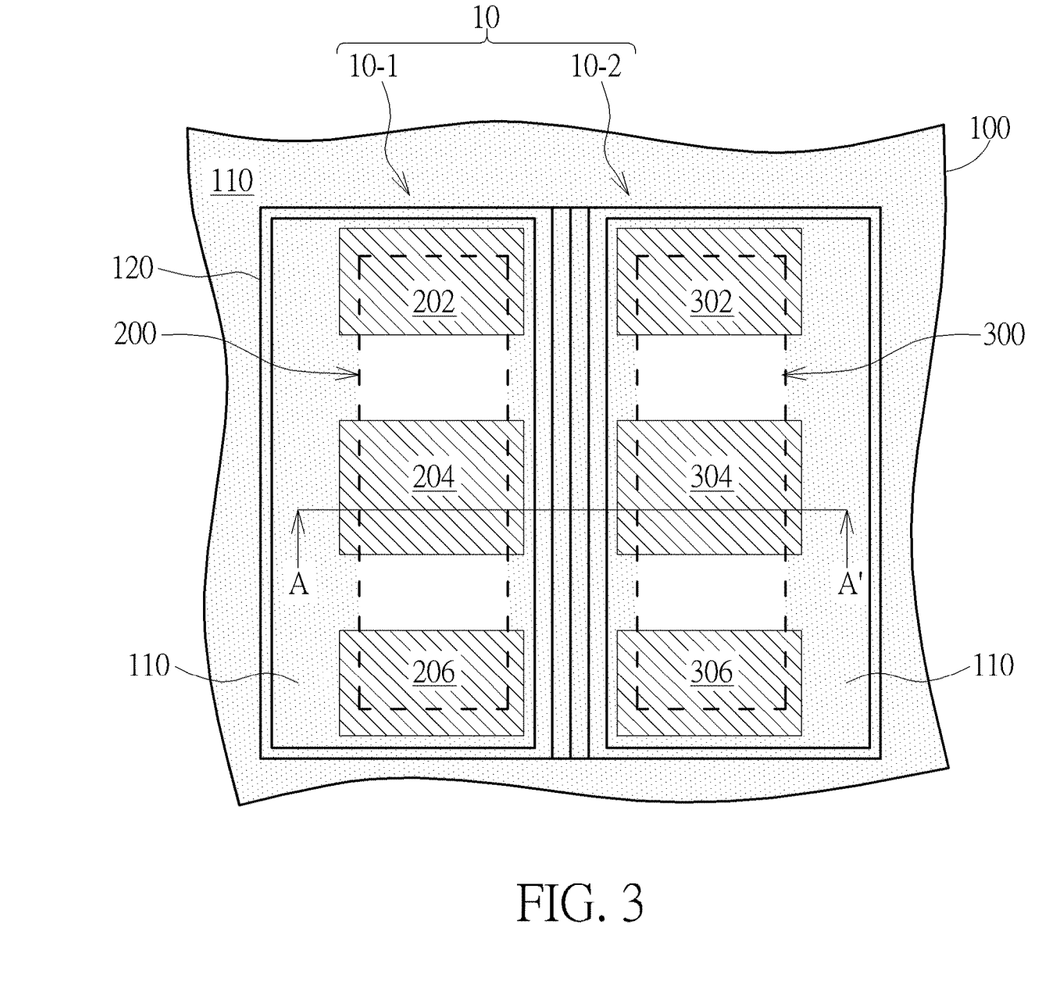
FIG. 3 is a schematic top view of a high-voltage semiconductor structure in accordance with one embodiment of the present disclosure.

FIG. 3 is a schematic top view of a high-voltage semiconductor structure in accordance with one embodiment of the present disclosure. Referring to FIG. 3, similar to the high-voltage semiconductor structure 10 shown in the embodiment of FIG. 2, the high-voltage semiconductor structure 10 shown in FIG. 3 includes not only the doped isolation region 110 but also an isolation pillar 120 surrounding the active regions 200, 300 of the high-voltage semiconductor devices 10-1, 10-2. In accordance with one embodiment of the present disclosure, the isolation pillar 120 may surround the periphery of the active regions 200, 300. In accordance with one embodiment of the present disclosure, the isolation pillar 120 may include a plurality of isolation pillars (or sub-isolation pillars), so that the isolation pillars may be separately disposed and surround the periphery of the active region 200 and that of the active region 300, respectively. In an embodiment of the present disclosure, the isolation pillar 120 may be formed earlier than the gate electrodes 204, 304, the source electrodes 202, 302, or the drain electrodes 206, 306 to ensure the aspect ratio of the isolation pillar 120. By setting the dimensions of the isolation pillar 120 and the doped isolation region 110 in a specific range, the desired electrical performance may be achieved, which will be described in detail in the following TABLE 1.

Figure 4:
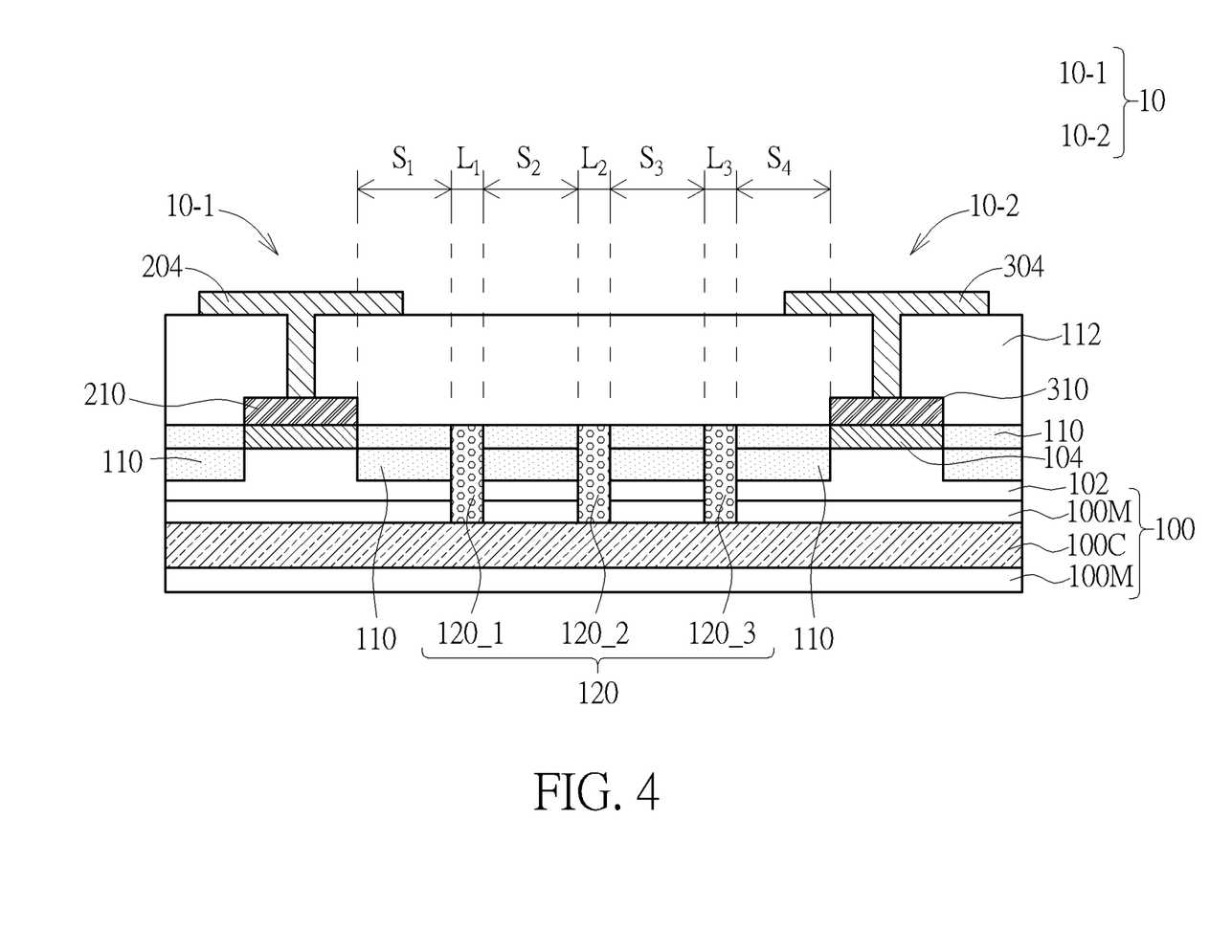
FIG. 4 is a schematic cross-sectional view of a high-voltage semiconductor structure taken along a line A-A' of FIG. 3 in accordance with one embodiment of the present disclosure.

FIG. 4 is a schematic cross-sectional view of a high-voltage semiconductor structure taken along a line A-A' of FIG. 3 in accordance with one embodiment of the present disclosure. Referring to FIG. 4, in accordance with one embodiment of the present disclosure, the isolation pillar 120 may include a plurality of isolation pillars, such as a first isolation pillar 120_1, a second isolation pillar 120_2, and a third isolation pillar 120_3. The isolation pillar 120 may be disposed between the high-voltage semiconductor devices 10-1 and 10-2, such as between the semiconductor cap layers 210, 310. In addition, the isolation pillar 120 is not limited to be disposed only at one side of the semiconductor cap layer 210 or the semiconductor cap layer 310, but may also be disposed at both sides of the semiconductor cap layer 210 or those of the semiconductor cap layer 310, or be disposed to further surround the periphery of the semiconductor cap layer 210 or the semiconductor cap layer 310. In accordance with one embodiment of the present disclosure, at least one of the first isolation pillar 120_1, the second isolation pillar 120_2, and the third isolation pillar 120_3 may penetrate the doped isolation region 110 and the composite material layer 100M so as to directly contact the doped isolation region 110 and the core layer 100C. In accordance with one embodiment of the present disclosure, when the doped isolation region 110 is disposed in the semiconductor barrier layer 104 and the semiconductor epitaxial layer 102, the first isolation pillar 120_1, the second isolation pillar 120_2, and the third isolation pillar 120_3 may also be regarded as penetrating the semiconductor barrier layer 104 and the semiconductor epitaxial layer 102. The isolation pillar 120 may be a single-layer structure or a composite structure, such as a single-layer structure containing only insulating material, or a composite structure containing both insulating material and conductive material buried in the insulating material, but not limited thereto. In accordance with one embodiment of the present disclosure, the first isolation pillar 120_1, the second isolation pillar 120_2, and the third isolation pillar 120_3 may each have a width $L_1$, $L_2$, and $L_3$. Spacing $S_1$ is between the first isolation pillar 120_1 and the semiconductor cap layer 210, and spacing $S_4$ is between the third isolation pillar 120_3 and the semiconductor cap layer 310. Spacing $S_2$ is between the first isolation pillar 120_1 and the second isolation pillar 120_2, and spacing $S_3$ is between the second isolation pillar 120_2 and the third isolation pillar 120_3. In accordance with one embodiment of the present disclosure, the first isolation pillar 120_1, the second isolation pillar 120_2, and the third isolation pillar 120_3 may be equally distributed, that is, the spacing $S_2$ is equal to the spacing $S_3$. In accordance with one embodiment of the present disclosure, the widths $L_1$, $L_2$ and $L_3$ of the isolation pillars 120_1, 120_2, and 120_3 may be smaller than the spacing $S_2$, $S_3$ between the isolation pillars 120_1, 120_2, and 120_3.

In accordance with one embodiment of the present disclosure, the isolation pillar 120 may be formed after the formation of the doped isolation region 110 and before the formation of the interlayer dielectric layer 112, but not limited thereto. For example, after performing an ion implantation process to form the doped isolation region 110, photolithography and etching processes may be performed to form at least one trench in the doped isolation region 110. The bottom of the trench may be etched down to the top surface of the core layer 100C so that the core layer 100C may be exposed from the trench. Then, an appropriate deposition process, such as a chemical vapor deposition process or a spin coating process, may be performed to fill the trench with insulating materials, thereby forming an isolation pillar 120 Referring to FIG. 4. Subsequently, an interlayer dielectric layer 112 may be further formed on the isolation pillar 120, and at least one electrode, such as gate electrodes 204, 304, may be formed on the surface of the interlayer dielectric layer 112.

In accordance with one embodiment of the present disclosure, in order to further reduce the thickness of the substrate 100, after forming electrodes on the surface of the interlayer dielectric layer 112, a grinding process may be performed on the back surface of the substrate 100 to completely remove the composite material layer 100M on the bottom surface of the core layer 100C, or further remove a portion of the core layer 100C until the substrate 100 is thinned to a predetermined thickness.

In accordance with one embodiment of the present disclosure, an operation method of a high-voltage semiconductor structure is disclosed. First, a high-voltage semiconductor structure, such as the high-voltage semiconductor structures 10 respectively shown in FIGS. 1 and 2 or FIGS. 3 and 4 are provided. Then, an electronic signal may be applied to the high-voltage semiconductor structure 10 under the condition that the ambient temperature is in a specific range. According to one example, a voltage higher than 200 volts (V) may be applied to the drain electrode 202 of the first high-voltage semiconductor device 10-1 under the condition that the ambient temperature falls within the range of 15° C. to 300° C., and the current transmitted from the drain electrode 306 of the second high-voltage semiconductor device 10-2 may be measured. According to another example, under the condition that the ambient temperature falls within the range of 15° C. to 300° C., the drain electrode 206 of the first high-voltage semiconductor device 10-1 may be applied with a voltage gradually increasing from −800V to 800V, and the relationship between $I_D$ and $V_G$ of the second high-voltage semiconductor device 10-2 may be measured.

The electrical characteristic of the high-voltage semiconductor structure according to some embodiments of the present disclosure is described below. The high-voltage semiconductor structure may be, for example, the high-voltage semiconductor structure 10 shown in FIGS. 1 and 2 or FIGS. 3 and 4, and both the high-voltage semiconductor devices 10-1, 10-2 are high electron mobility transistors.

In accordance with one embodiment of the present disclosure, a voltage in a range from 200V to 800V may be applied to the drain electrode 206 of the first high-voltage semiconductor device 10-1 shown in FIG. 2 and FIG. 4 at an ambient temperature of 25$t$, and the current transmitted from the drain electrode 306 of the second high-voltage semiconductor device 10-2 may be measured. In addition, for the high-voltage semiconductor structure shown in FIG. 2, the lateral dimension of the doped isolation regions 110 between the adjacent high-voltage semiconductor devices 10-1 and 10-2 may be adjusted to obtain the doped isolation regions 110 with various lateral dimensions. The above measurement may be performed on the corresponding high-voltage semiconductor structures 10. Similarly, for the high-voltage semiconductor structure shown in FIG. 4, the number of isolation pillars 120 may be adjusted, and the above measurement may be performed on the corresponding high-voltage semiconductor structures 10. The measurement result is shown in TABLE 1 below.

TABLE 1

| | doped isolation region | | | doped isolation region + isolation pillar(s) | | |
|---|---|---|---|---|---|---|
| | Ser. No. | | | | | |
| | 1 | 2 | 3 | 4 | 5 | 6 |
| No. of isolation pillar(s)*1 | N.A. | N.A. | N.A. | 1 | 3 | 5 |
| Overall width (μm) of isolation region*2 | 5-10 | 10-20 | 20-30 | 5-10 | 10-20 | 20-30 |
| Applied voltage (V) at 1 μA*3 | 1550 | 1900 | 1900 | >2000 | >2000 | >2000 |
| Applied voltage (V) at 1 nA*3 | 950 | 1250 | 1250 | 1000 | 1750 | 1750 |
| Applied voltage (V) at initial current*3 | 200 | 200 | 200 | 600 | 800 | 800 |

*1 The number of isolation pillars refers to the number of the isolation pillars between two adjacent high-voltage semiconductor devices.
*2 The overall width of the isolation region refers to the width of the doped isolation region between two adjacent active regions of the high-voltage semiconductor structure.
*3 The applied voltage refers to a voltage, when the drain electrode of a high-voltage semiconductor device outputs electric current with a specified magnitude, that should be applied to the drain electrode of an adjacent another high-voltage semiconductor device.

According to the result shown in TABLE 1, for cases where the high-voltage semiconductor device 10 includes the doped isolation region 110 or both the doped isolation region 110 and the isolation pillar 120, only when a voltage applied to the drain electrode 206 of the high-voltage semiconductor device 10-1 is greater than at least 950V, the drain electrode 306 of the adjacent high-voltage semiconductor device 10-2 could generate a current of 1 nA. In addition, for the high-voltage semiconductor device 10 including both the doped isolation region 110 and the isolation pillar 120, its voltage withstanding capability is higher than that of the high-voltage semiconductor device 10 including only the doped isolation region 110. In addition, when the number of isolation pillars 120 reaches 2, its voltage withstanding capability is saturated. Therefore, in order to prevent the isolation pillar 120 from occupying too many surface areas of a chip, the sizes of the isolation pillar 120 and the doped isolation region 110 may be set in a specific range, so as to achieve the desired electrical performance.

Figure 5:
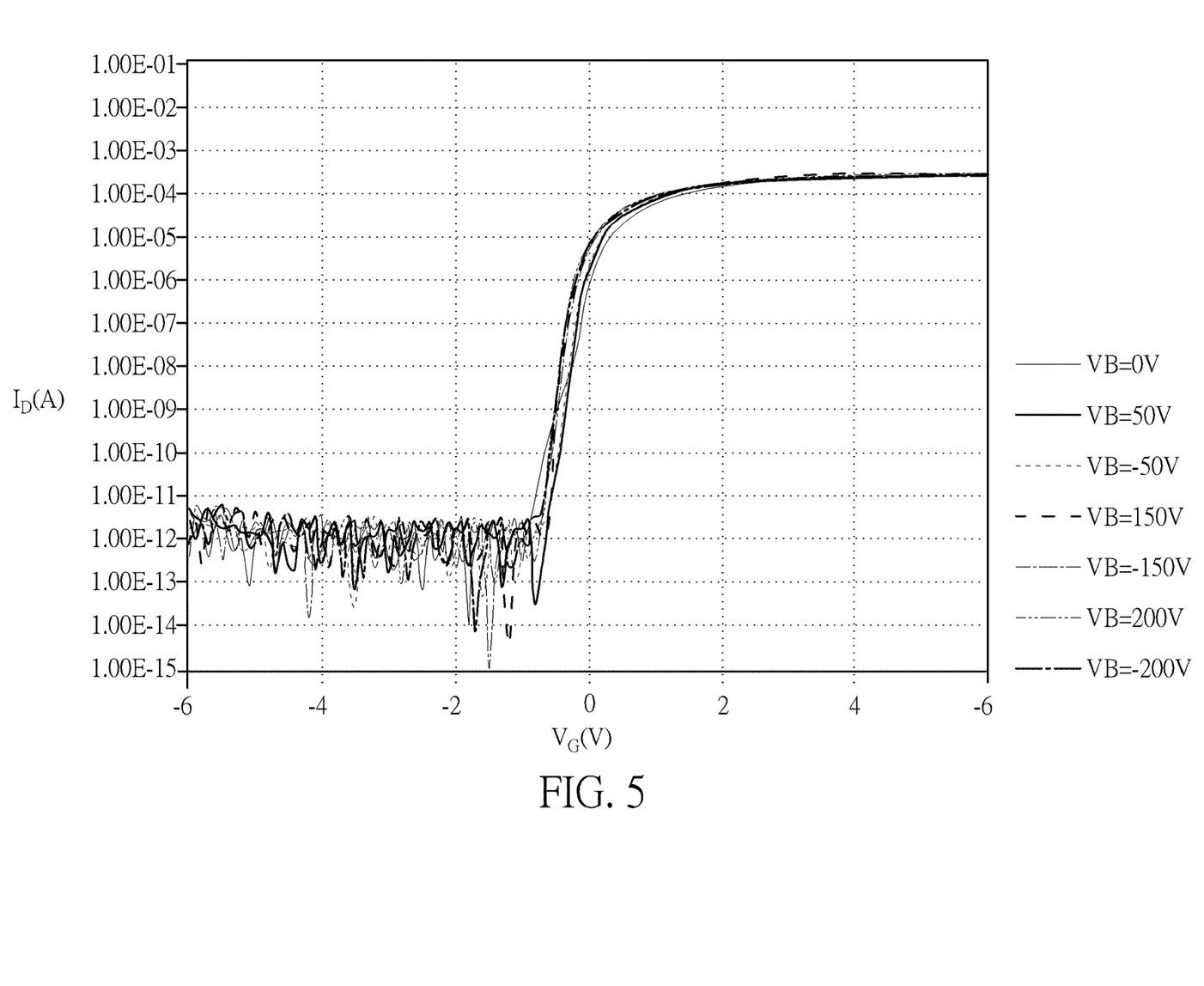
FIG. 5 and FIG. 6 are electrical characteristics of a high-voltage semiconductor structure operated at normal temperature in accordance with some embodiments of the present disclosure.
Figure 6:
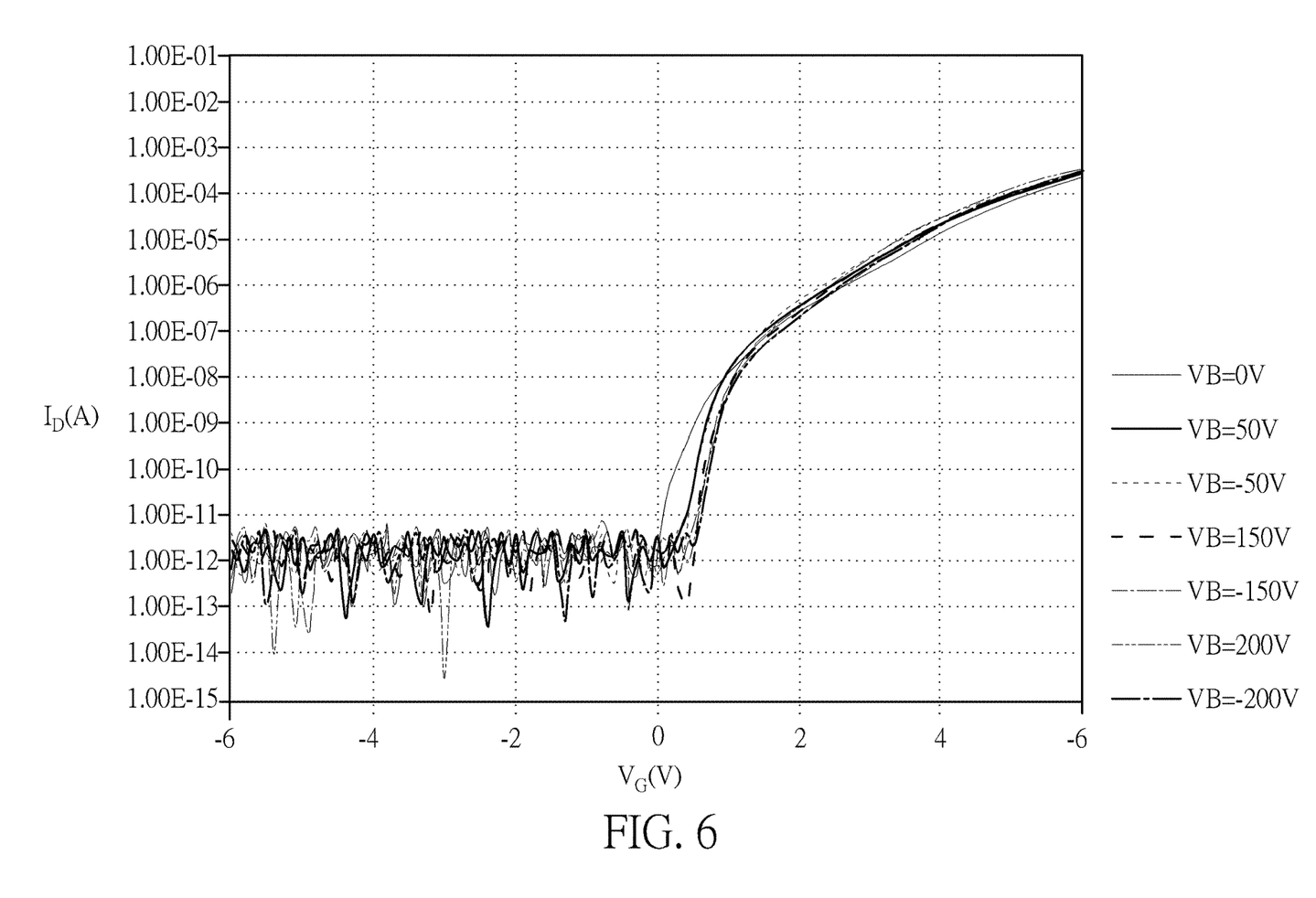

In accordance with one embodiment of the present disclosure, a voltage of −200V to 200V may be applied to the drain electrode 206 of the first high-voltage semiconductor device 10-1 shown in FIG. 2 and FIG. 4 at an ambient temperature of 25° C., and the relationship between $I_D$ and $V_G$ of the second high-voltage semiconductor device 10-2 may be measured. The measurement results are shown in FIG. 5 and FIG. 6 respectively. FIG. 5 and FIG. 6 are electrical characteristics of the high-voltage semiconductor structure at normal temperature in accordance with some embodiments of the present disclosure. FIG. 5 corresponds to the electrical characteristics of the high-voltage semiconductor structure 10 shown in FIG. 2, and FIG. 6 corresponds to the electrical characteristics of the high-voltage semiconductor structure 10 shown in FIG. 4. Referring to FIGS. 5 and 6, regardless of the voltage applied to the drain electrode 206 of the first high-voltage semiconductor device 10-1, the relationship between $I_D$ and $V_G$ of the second high-voltage semiconductor device 10-2 may be kept substantially the same. In other words, the threshold voltage of the second high-voltage semiconductor device 10-2 does not shift due to the voltage applied to the first high-voltage semiconductor device 10-1.

Figure 7:
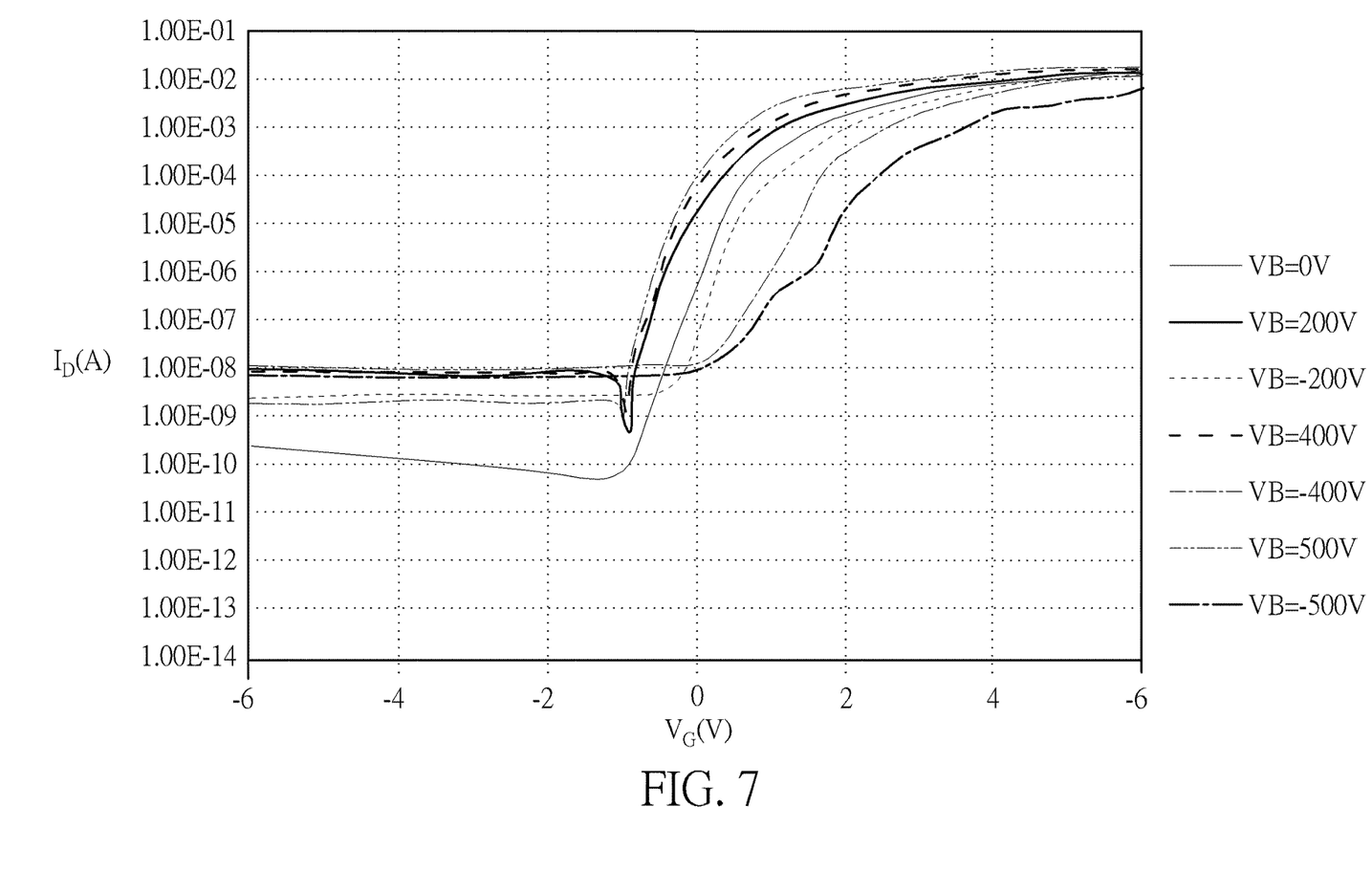
FIG. 7 and FIG. 8 are electrical characteristics of a high-voltage semiconductor structure operated at high temperature in accordance with some embodiments of the present disclosure.
Figure 8:
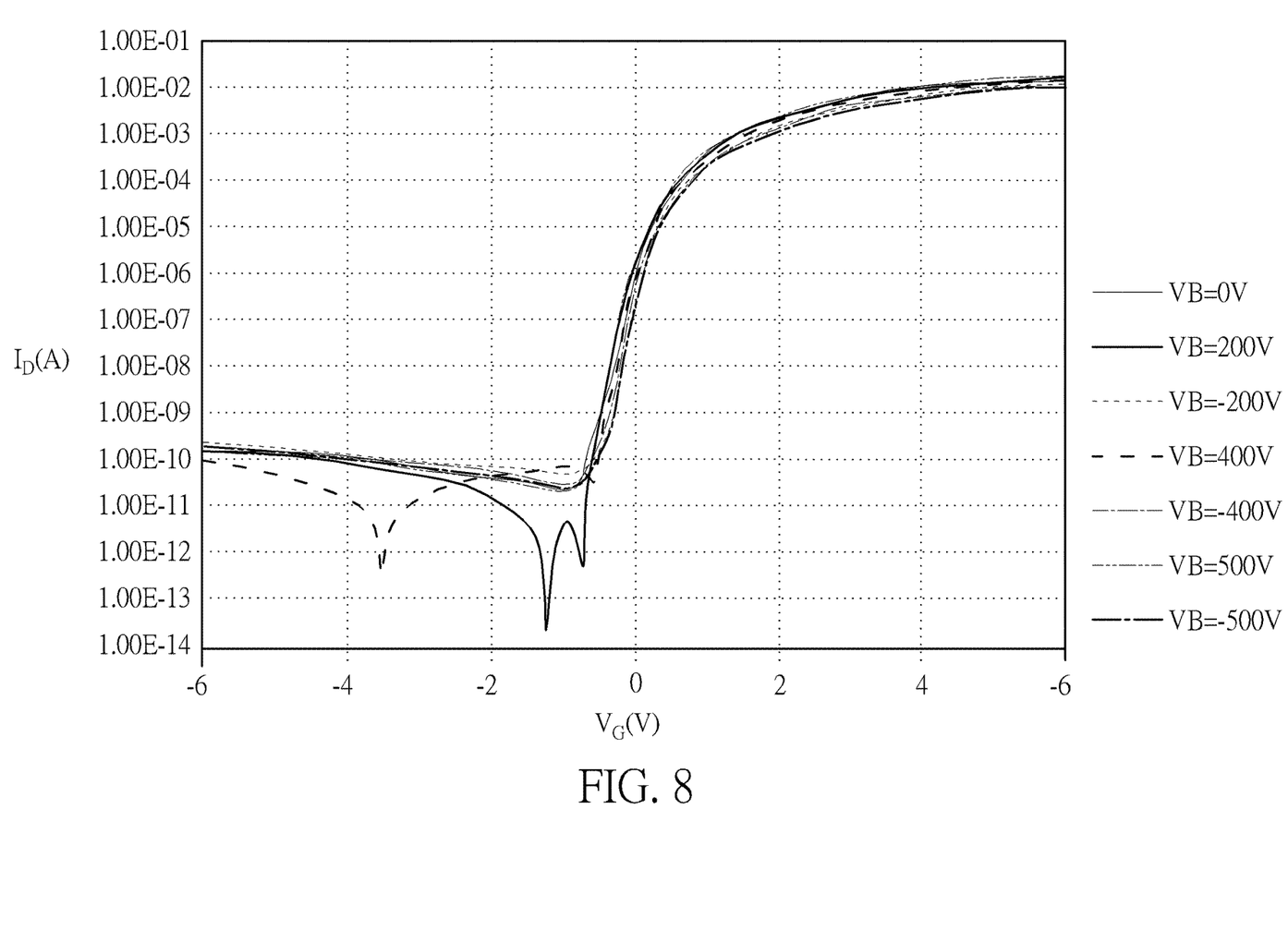

Similarly, in accordance with one embodiment of the present disclosure, a voltage of −500V to 500V may be applied to the drain electrode 206 of the first high-voltage semiconductor device 10-1 shown FIGS. 2 and 4 at an ambient temperature of 150° C., and the relationship between $I_D$ and $V_G$ of the second high-voltage semiconductor device 10-2 may be measured. The measurement results are shown in FIG. 7 and FIG. 8, respectively. FIG. 7 and FIG. 8 are electrical characteristics of the high-voltage semiconductor structure at high temperature in accordance with some embodiments of the present disclosure. FIG. 7 corresponds to the electrical characteristics of the high-voltage semiconductor structure 10 shown in FIG. 2, and FIG. 8 corresponds to the electrical characteristics of the high-voltage semiconductor structure 10 shown in FIG. 4. Referring to FIG. 7, when a negative voltage or a positive voltage is applied to the drain electrode 206 of the first high-voltage semiconductor device 10-1, the relationship between $I_D$ and $V_G$ of the second high-voltage semiconductor device 10-2 changes. In other words, the threshold voltage of the second high-voltage semiconductor device 10-2 is shifted due to the voltage applied to the first high-voltage semiconductor device 10-1. In addition, as the voltage applied to the first high-voltage semiconductor device 10-1 gradually increases, the shift in the threshold voltage of the second high-voltage semiconductor device 10-2 becomes more significant. In contrast, referring to FIG. 8, the relationship between $I_D$ and $V_G$ of the second high-voltage semiconductor device 10-2 may be kept substantially the same regardless of the voltage applied to the drain electrode 206 of the first high-voltage semiconductor device 10-1. In other words, the threshold voltage of the second high-voltage semiconductor device 10-2 does not shift due to the voltage applied to the first high-voltage semiconductor device 10-1.

Figure 9:
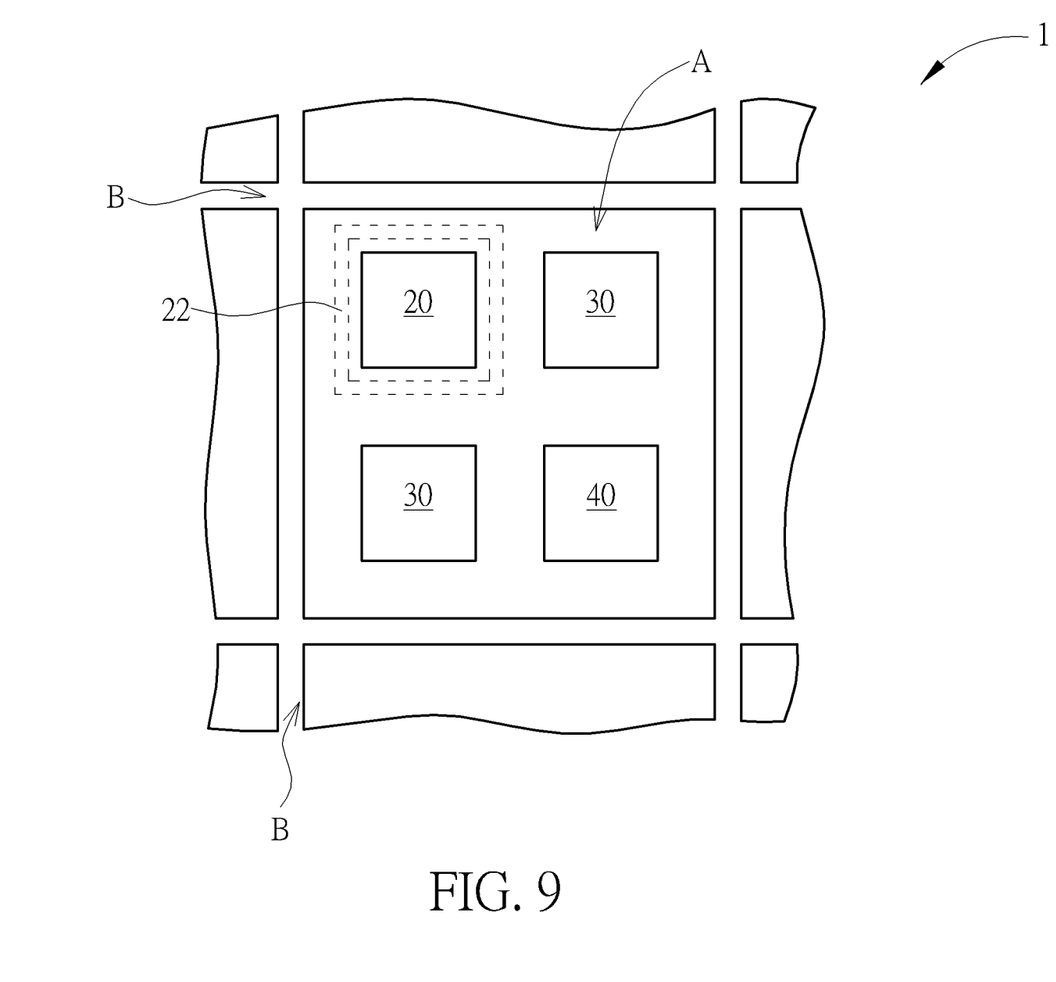
FIG. 9 is a schematic top view of a chip structure according in accordance with one embodiment of the present disclosure.

FIG. 9 is a schematic top view of a chip structure in accordance with one embodiment of the present disclosure. Referring to FIG. 9, the chip structure 1 may be disposed in a die region A of a wafer, and the periphery of the die region A may be surrounded by a scribe line region B. The chip structure 1 may include at least one high-voltage semiconductor device 20 and a low-voltage semiconductor device (such as a logic device 30 or a memory device 40), and the high-voltage semiconductor device 20 may be surrounded by an isolation region 22. The high-voltage semiconductor device 20 may be the high electron mobility transistor described in the above embodiments, and the doped isolation region and/or isolation pillar may be disposed in the isolation region 22.

Figure 10:
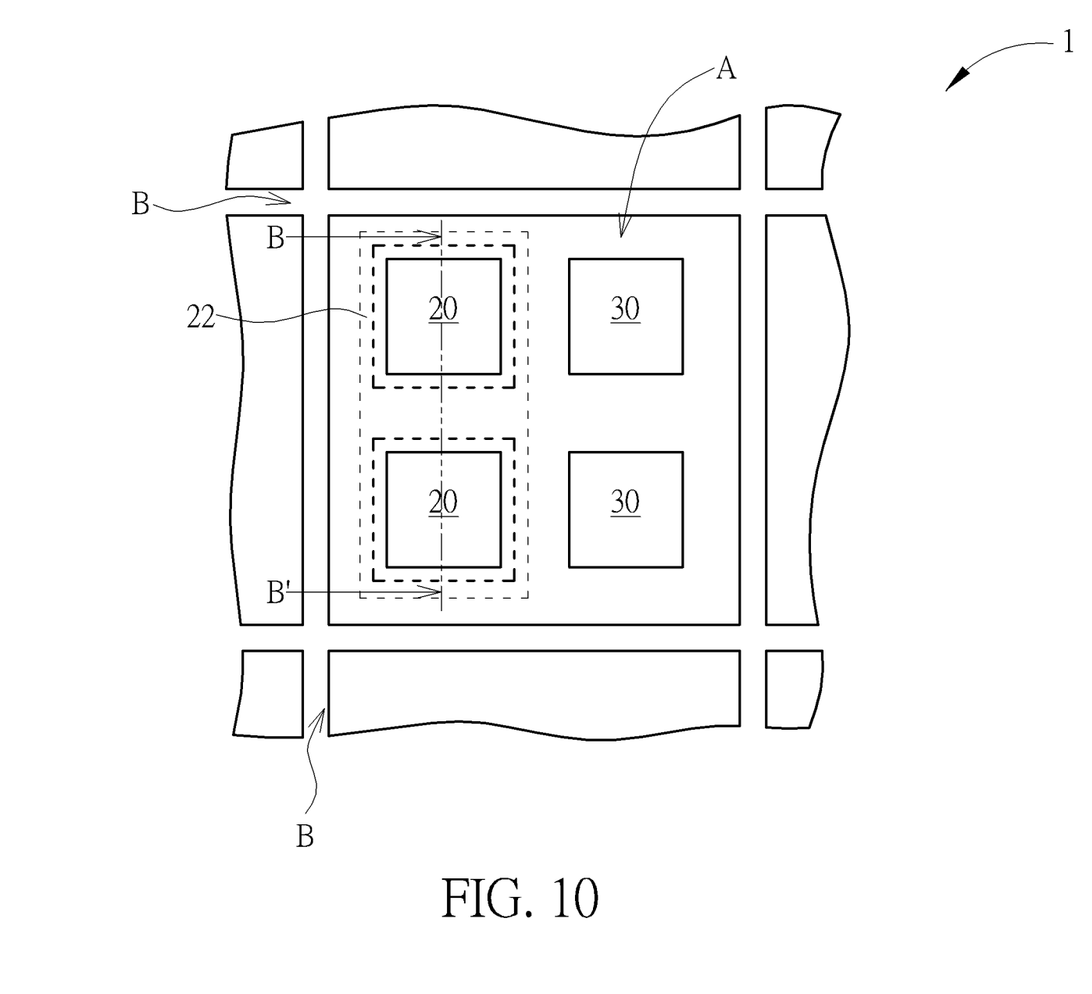
FIG. 10 is a schematic top view of a chip structure in accordance with one embodiment of the present disclosure.

FIG. 10 is a schematic top view of a chip structure in accordance with one embodiment of the present disclosure. The wafer structure 1 in FIG. 10 differs from the wafer structure 1 in FIG. 9 mainly in that the wafer structure 1 in FIG. 10 may include at least two high-voltage semiconductor devices 20, and each of the high-voltage semiconductor devices 20 may be surrounded by an isolation region 22.

Figure 11:
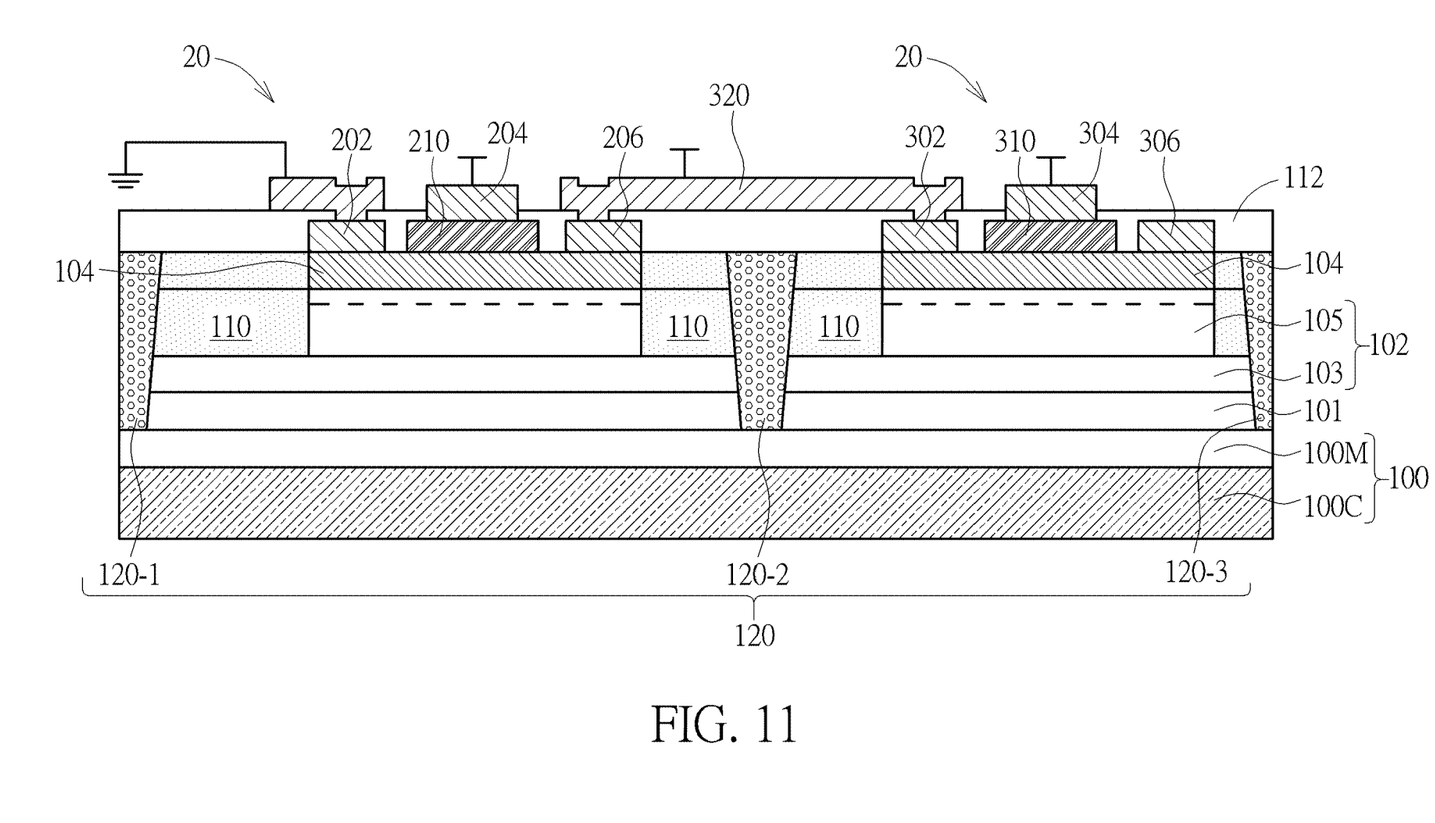
FIG. 11 is a schematic cross-sectional view of a high-voltage semiconductor structure taken along a line B-B' of FIG. 10 in accordance with one embodiment of the present disclosure.

FIG. 11 is a schematic cross-sectional view of a high-voltage semiconductor structure taken along a line B-B' of FIG. 10 in accordance with one embodiment of the present disclosure. Referring to FIG. 11, in accordance with one embodiment of the present disclosure, each high-voltage semiconductor device 20 may include a substrate 100, a silicon-containing semiconductor layer 101, a semiconductor epitaxial layer 102, a semiconductor barrier layer 104, and semiconductor cap layers 210, 310 from bottom to top. A 2DEG region (indicated by the dotted line) may exist at the interface between the semiconductor channel layer 105 and the semiconductor barrier layer 104. In addition, the source electrode 302 of one high-voltage semiconductor device 20 may be connected to the drain electrode 206 of adjacent another high-voltage semiconductor device 20 in series through a conductive wire 320, but not limited thereto. In accordance with one embodiment of the present disclosure, a doped isolation regions 110 and an isolation pillar 120 may be disposed between and around adjacent high-voltage semiconductor devices 20. The doped isolation region 110 may be obtained by doping or damaging the semiconductor barrier layer 104, the semiconductor channel layer 105, and/or a portion of the semiconductor buffer layer 103. The upper portion of the isolation pillar 120 may be disposed in the doped isolation region 110, and the lower portion of the isolation pillar 120 may penetrate the semiconductor buffer layer 103 and the silicon-containing semiconductor layer 101, or further penetrate the composite material layer 100M.

According to the above embodiments, by providing the high-voltage semiconductor structure with the doped isolation region or both the doped isolation region and the isolation pillar, it is possible to prevent the high-voltage semiconductor devices in the high-voltage semiconductor structure from affecting the electrical performance of other high-voltage semiconductor devices and low-voltage semiconductor devices. In addition, for the high-voltage semiconductor structure including the doped isolation region and the isolation pillar, the threshold voltage of the high-voltage semiconductor structures is less likely to be shifted at high temperature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate comprising a core layer and a composite material layer;
a semiconductor epitaxial layer disposed on the substrate;
a semiconductor barrier layer disposed on the semiconductor epitaxial layer;
a first semiconductor device disposed on the substrate, wherein the first semiconductor device comprises a first semiconductor cap layer disposed on the semiconductor barrier layer;
a doped isolation region disposed at one side of the first semiconductor device, wherein a dopant of the doped isolation region is non-conductive; and
at least one isolation pillar at least partially disposed in the doped isolation region, wherein the at least one isolation pillar surrounds at least a portion of the first semiconductor device and penetrates the composite material layer.

2. The semiconductor structure of claim 1, wherein the core layer comprises aluminum nitride, silicon carbide, aluminum oxide, or a combination thereof.

3. The semiconductor structure of claim 1, wherein the at least one isolation pillar is in direct contact with the substrate.

4. The semiconductor structure of claim 1, wherein the first semiconductor device comprises a gate electrode, a source electrode and a drain electrode, and the at least one isolation pillar does not extend higher than a top surface of the gate electrode.

5. The semiconductor structure of claim 1, wherein the semiconductor structure further comprises a second semiconductor device disposed in proximity to the first semiconductor device, and the at least one isolation pillar comprises a plurality of isolation pillars respectively surrounding the first semiconductor device and the second semiconductor device.

6. The semiconductor structure of claim 5, wherein a number of the plurality of isolation pillars is 3.

7. The semiconductor structure of claim 1, wherein the semiconductor structure further comprises a second semiconductor device disposed on the substrate, wherein the second semiconductor device comprises a second semiconductor cap layer disposed on the semiconductor barrier layer, and the doped isolation region is disposed between the first semiconductor device and the second semiconductor device.

8. The semiconductor structure of claim 7, wherein the first semiconductor device is a high-voltage device and the second semiconductor device is a low-voltage device.

9. The semiconductor structure of claim 5, wherein the plurality of isolation pillars are distributed with equal spacing.

10. The semiconductor structure of claim 5, wherein a width of each of the plurality of isolation pillars is smaller than each of spacing between the plurality of isolation pillars.

11. The semiconductor structure of claim 1, wherein the composite material layer comprises an oxide layer, a semiconductor layer, a nitride layer, and a further oxide layer stacked in sequence.

12. A chip structure, comprising:
a substrate comprising a core layer and a composite material layer;
a first semiconductor device disposed on the substrate;
a second semiconductor device disposed on the substrate and separated from the first semiconductor device;
a doped isolation region disposed between the first semiconductor device and the second semiconductor device, wherein a dopant of the doped isolation region is non-conductive; and
at least one isolation pillar completely surrounding the first semiconductor device and penetrating the composite material layer.

13. The chip structure of claim 12, wherein the first semiconductor device is a high-voltage semiconductor device, and the second semiconductor device is a low-voltage semiconductor device.

14. The chip structure of claim 12, wherein the core layer comprises aluminum nitride, silicon carbide, aluminum oxide, or a combination thereof.

15. The chip structure of claim 12, wherein the composite material layer comprises an oxide layer, a semiconductor layer, a nitride layer, and a further oxide layer stacked in sequence.

16. The chip structure of claim 12, wherein the at least one isolation pillar comprises an electrical insulating material and directly contacts the core layer.

17. The chip structure of claim 12, wherein the at least one isolation pillar comprises a plurality of isolation pillars surrounding the first semiconductor device.

18. The semiconductor structure of claim 1, wherein a top surface of the doped isolation region, a top surface of the at least one isolation pillar and a top surface of the semiconductor barrier layer are on the same plane.

19. The semiconductor structure of claim 1, wherein an edge of the doped isolation region is aligned with an edge of the first semiconductor cap layer.

20. The chip structure of claim 12, wherein the first semiconductor device comprises a first semiconductor cap layer, and an edge of the doped isolation region is aligned with an edge of the first semiconductor cap layer.

* * * * *